(12) United States Patent
Kim et al.

(10) Patent No.: US 7,411,742 B1
(45) Date of Patent: Aug. 12, 2008

(54) FOCUSING LENS FOR LED

(75) Inventors: Jin-Ho Kim, Gyeonggi-do (KR);
Shung-Hoon Hwang, Seoul (KR);
Hee-Joong Lee, Seoul (KR)

(73) Assignee: Sekonix Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/690,866

(22) Filed: Mar. 26, 2007

(51) Int. Cl.
*G02B 13/18* (2006.01)
*G02B 3/00* (2006.01)

(52) U.S. Cl. ............ 359/718; 359/642; 359/708; 359/710; 359/712; 359/719; 359/800; 359/641; 359/651; 359/741; 369/112.01

(58) Field of Classification Search ............ 359/642, 359/708, 710, 712, 718, 719, 800, 641, 651, 359/741; 369/112.01
See application file for complete search history.

(56) References Cited

U.S. PATENT DOCUMENTS

| | | | |
|---|---|---|---|
| 5,572,367 A * | 11/1996 | Jung et al. | 359/708 |
| 5,777,803 A * | 7/1998 | Ju et al. | 359/719 |
| 7,054,074 B2 * | 5/2006 | Mizuno et al. | 359/719 |

\* cited by examiner

*Primary Examiner*—Evelyn A. Lester
(74) *Attorney, Agent, or Firm*—Mark M. Friedman

(57) ABSTRACT

A focusing lens for an LED is provided. The focusing lens for an LED, which concentrates light emitted from the LED so as to have directionality parallel to an optic axis, comprises: a transparent body; a first lens part formed in the body; and a second lens part covering the first lens, and wherein the first lens comprises: first and second aspheric lens surfaces which are convex in different sizes and are formed on planes being symmetric to each other; and wherein the second lens comprise: a plane of incidence formed to protrude from an outer circumference of the second aspheric lens surfaces, the plane of incidence into which the LED is inserted and which is configured to allow the light emitted from the LED to be incident and refracted; a plane of reflection formed to have a convex curved surface which extend and slopes to be progressive wider from the plane of incidence towards the second aspheric lens surface, the plane of reflection which is configured to allow the light emitted from the LED to be totally reflected; and a plane of emission formed to have a concave curved surface which extends and slopes from the plane of reflection towards the second aspheric lens surface, the plane of emission which is configured to allow the light emitted from the LED to be refracted and emitted as light being parallel to the optic axis. The focusing lens minimizes a loss of the light emitted from the LED and maximally reduces an angle of the emitted light, to effectively illuminate a local region at a long distance.

9 Claims, 3 Drawing Sheets

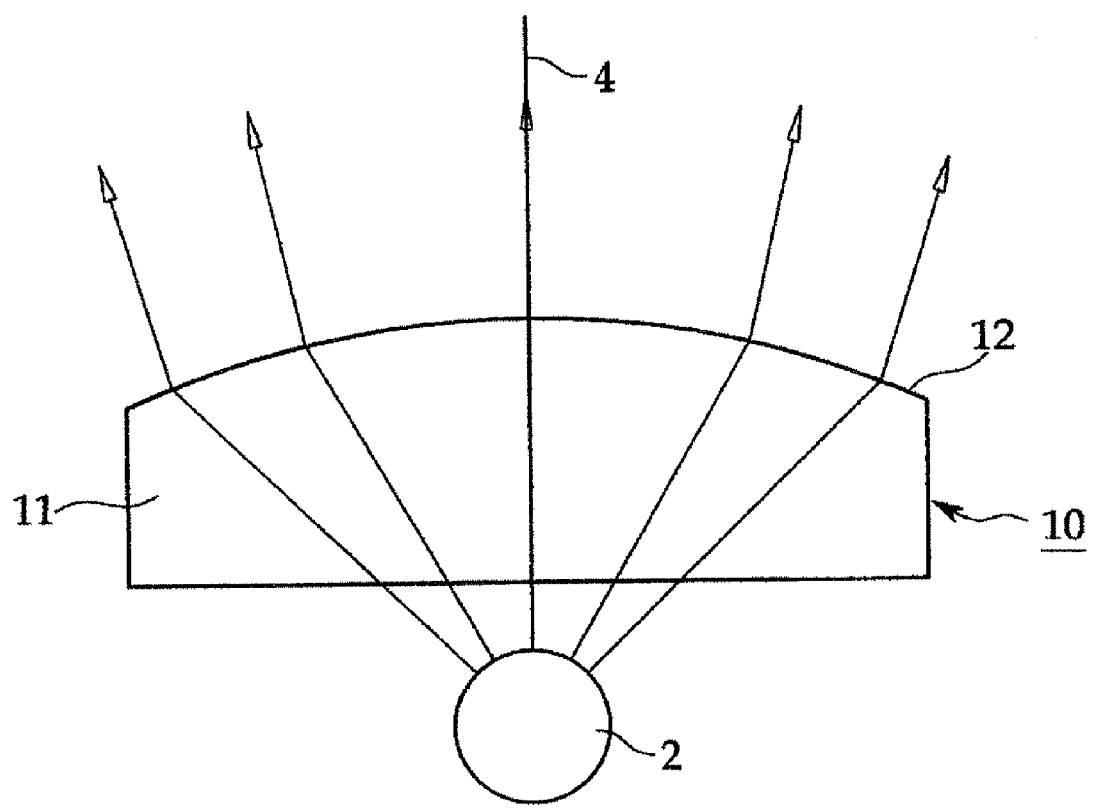
Prior Art
[Fig 1]

[Fig 2]
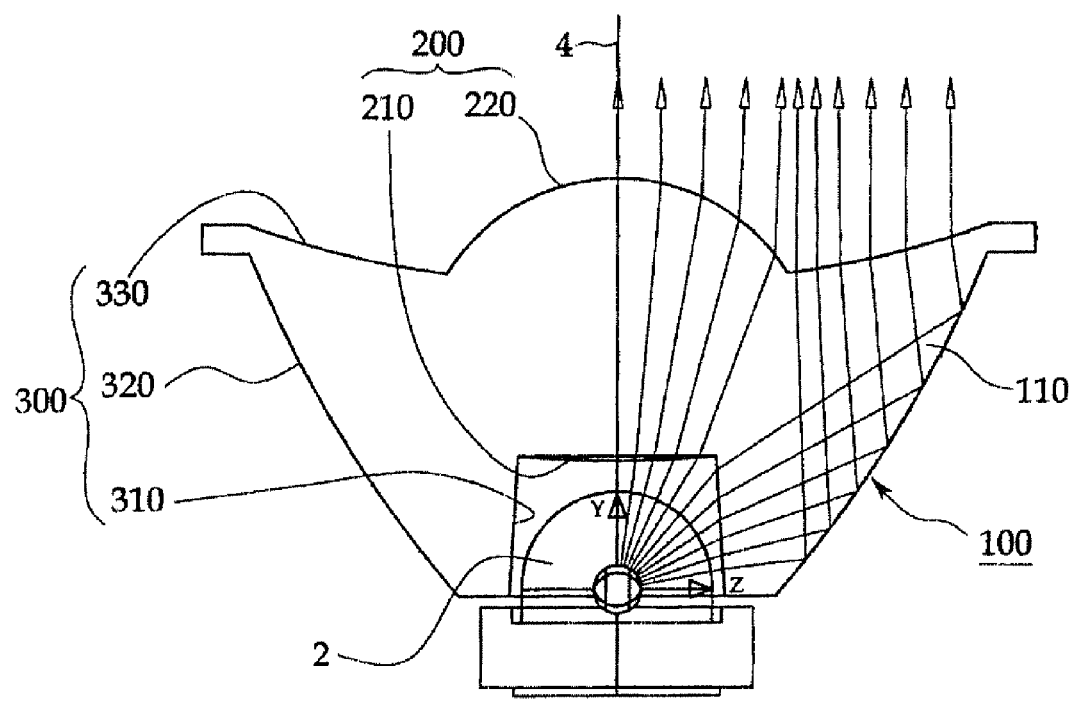

[Fig 3]
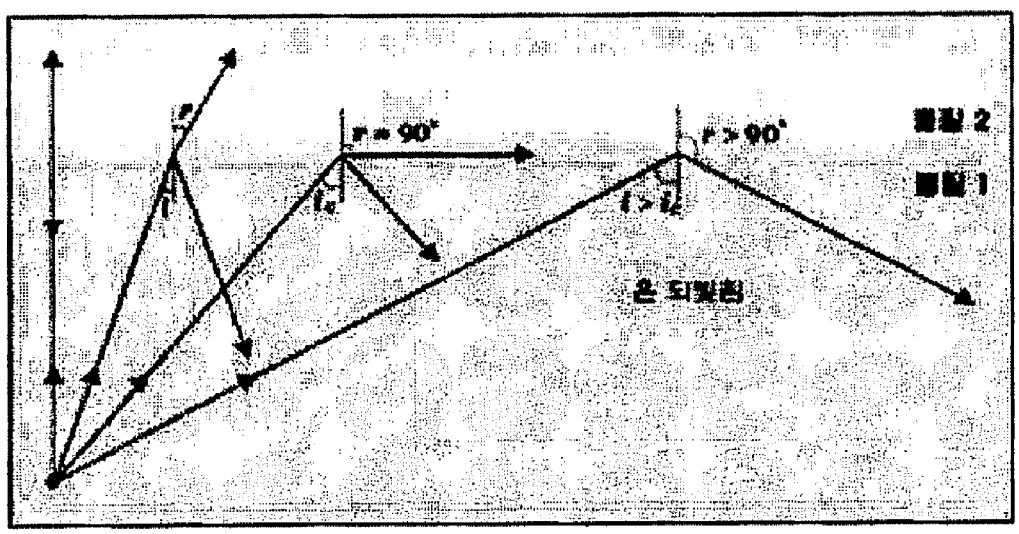

FOCUSING LENS FOR LED

CROSS-REFERENCE TO RELATED APPLICATION

This application claims priority from Korean Patent Application No. 10-2007-0017123 filed on Feb. 20, 2007 with the Korean Intellectual Property Office, the entire contents of which is incorporated herein by reference.

BACKGROUND OF THE INVENTION

1. Technical Field

The present invention relates to a focusing lens for a light-emitting diode (LED) and, more particularly, to a focusing lens for an LED, which controls a radiation angle of the LED, to locally illuminate at a long distance.

2. Discussion of Related Art

Generally, the irradiation of light illuminated by an LED, that is, the radiation angle of the LED, is very great due to the characteristic of the LED. Therefore, the LED is mainly used to irradiate a broad region or to illuminate a close distance.

Since the LED has the characteristic in that the radiation angle thereof is very great, when it is used to irradiate a local region at a long distance, the etendue occurs so that the emitted light is not effectively used.

To minimize the aforementioned problem, a focusing lens to focus the light emitted by the LED shown in FIG. 1 has been developed.

As illustrated in FIG. 1, a conventional focusing lens 10 is positioned at a position where light of an LED 2 is radiated.

In the focusing lens 10, the whole of a body 11 is composed of a material, such as transparent glass. The top surface of the focusing lens 10 is formed of an aspheric lens surface 12 which is a curved surface to bulge upward.

The focusing lens 10 of the aspheric lens allows the light of the LED 2, which is radiated at 180°, to be transmitted through the flat bottom surface of the focusing lens 10 and to be concentrated on the aspheric lens surface of the top surface of the focusing lens 10, at the radiation angle which is less than about 150, to be irradiated.

The aforementioned conventional focusing lens 10 somewhat improves the efficiency of concentrating light around an optic axis 4 by the aspheric lens surface 12. However, the light-concentrating efficiency is restrictedly performed only around the optic axis 4. Around the edge of the focusing lens 10 which is distant from the optic axis 4, the light is refracted and diffused in an outside direction which is distant from the optic axis 4. Therefore, the conventional focusing lens 10 has a limit in locally illuminating at a long distance.

SUMMARY OF THE INVENTION

Therefore, the present invention is directed to provide a focusing lens for an LED, which concentrates all of light emitted by the LED so as to have directionality parallel to an optic axis, thereby minimizing a loss of the light emitted by the LED and effectively illuminating a location region at a long distance.

In accordance with an exemplary embodiment, the present invention provides a focusing lens for an LED, which concentrates light emitted by the LED to have directionality parallel to an optic axis, comprising: a transparent body having a first lens part and a second lens part covering the first lens part, and wherein the first lens part comprises: first and second aspheric lens surfaces which are formed on planes being symmetric to each other and which are convex and are different from each other in size, and the second lens part comprises: a plane of incidence formed to protrude from an outer circumference of the second aspheric lens surface, the plane of incidence where the LED is inserted and which is configured to allow the light emitted from the LED to be incident and refracted, a plane of reflection formed to have a convex curved surface which extends and slopes to get progressively wider from the plane of incidence towards the second aspheric lens surface, the plane of reflection which is configured to allow the light of the LED to be totally reflected; and a plane of emission formed to have a concave curved surface which extends and slopes from the plane of reflection towards the second aspheric lens surface, the plane of emission which is configured to allow the totally reflected light of the LED to be refracted as the light parallel to the optic axis and to be emitted.

The plane of reflection may be formed on a condition of total internal reflection, and the plane of incidence may be formed to slope to get progressively wider outward from the first aspheric lens surface towards an end of the plane of incidence.

When the LED has the radiation angle of 0° to 32°, the first aspheric lens surface may be formed to have the emission angle of 0° to 21°, and the second aspheric lens surface to have the emission of 0° to 3.5°, and when the LED has the radiation angle of 40° to 80°, the plane of incidence may be formed to have the emission angle of 57° to 82°, the plane of reflection to have the emission of 2° to 6°, and the plane of emission to have the emission angle of 0.3° to 0.65°.

BRIEF DESCRIPTION OF THE DRAWINGS

The above and other features and advantages of the present invention will be more apparent by describing certain exemplary embodiments of the present invention with reference to the attached drawings, in which:

FIG. 1 illustrates a conventional focusing lens for an LED;

FIG. 2 illustrates a focusing lens for an LED according to an exemplary embodiment of the present invention; and FIG. 3 is a view for explaining total internal reflection of the focusing lens for an LED according to the exemplary embodiment of the present invention.

DETAILED DESCRIPTION OF EXEMPLARY EMBODIMENTS

The present invention will now be described more fully with reference to the accompanying drawings, in which an exemplary embodiment of the invention is shown.

FIGS. 2 and 3 are views for explaining a focusing lens 100 for an LED 2 according to the present invention.

As illustrated in FIG. 2, the focusing lens 100 is to concentrate light emitted from the LED 2, to have directionality.

The focusing lens 100 comprises a transparent body 110. The body 110 comprises a first lens part 200 and a second lens part 300. The first lens part 200 is formed of a convex aspheric lens at a middle part of the body 110. The second lens part 300 covers an edge part of the first lens part 200.

The first lens part 200 comprises first and second aspheric lens surfaces 210 and 220. The first and second aspheric lens surfaces 210 and 220 are formed to be convex, in different sizes, on planes which are symmetric to each other, that is, upper and lower planes.

The second lens part 300 comprises: a plane of incidence 310, a plane of reflection 320 and a plane of emission 330. The plane of incidence 310 is formed to protrude from an outer circumference of the second aspheric lens surface 220. The LED 2 is inserted into the plane of incidence 310 and the light emitted from the LED 2 is incident on the plane of incidence 310 and refracted thereon. The plane of reflection 320 is formed to have an oval-shaped curved surface which extends and slopes to get progressively wider from the plane of incidence 310 towards the second aspheric lens surface 220. The light of the LED 2 is totally reflected on the plane of reflection 320. The plane of emission 330 is formed to have a concave curved surface which extends and slopes from the plane of reflection 320 towards the second aspheric lens surface 220. The totally reflected light of the LED 2 is refracted as the light parallel to an optic axis 4 and is emitted from the plane of emission 330.

The plane of reflection 320 is formed on a condition of total internal reflection. The plane reflection 320 prevents a transmission loss of the light of the LED 2 which is incident through the plane of incidence 310, to minimize the loss of the light and to maximally use the light emitted from the LED 2.

The plane of incidence 310 is formed to slope to get progressively wider outward from the first aspheric lens surface 210 towards an end of the plane of incidence 310. The plane of incidence 310 may be formed at a slope of about 4°.

When the radiation angle of the LED 2, which is inserted into the plane of incidence 310 of the second lens part 300, is within the range of 0° to 35°, based on the off-axis of 35°, the light at the radiation angle of 0° to 35° is incident on the first aspheric lens surface 210 of the first lens part 200 and emitted to the second aspheric lens surface 220. The light at the radiation angle of 35° or more is incident on the plane of incidence 310 of the second lens part 300, reflected on the plane of reflection 320 and then emitted onto the plane of is emission 330.

Then, since the LED 2 is covered by the first aspheric lens surface 210 and the plane of incidence 310, the light emitted from the LED 2 at 180° is maximally transmitted through the first aspheric lens surface 210 and the plane of incidence 310, without a loss.

Therefore, when the radiation angle is within the range of 0° to 32° of the off-axis of the LED 2, the first aspheric lens surface 210 is formed to have the emission angle of 0° to 21°, and the second aspheric lens surface 220 to have the emission of 0° to 3.5°. When the radiation angle of the LED 2 is within the range of 40° to 80°, the plane of incidence 310 is formed to have the emission angle of 57° to 82°, the plane of reflection 320 to have the emission of 2° to 6°, and the plane of emission 330 to have the emission angle of 0.3° to 0.65°.

The operation of the focus lens for the LED according to the present invention will be described below:

As illustrated in FIG. 2, when the LED 2 is inserted into an opening formed by the first aspheric lens surface 210 and the plane of incidence 310 of the focusing lens 100, most of the light emitted from the LED 2 at 180° is incident on the first aspheric lens surface 210 and the plane of incidence 310.

Then, the light emitted from the LED under 35° is incident on the first aspheric lens surface 210 of the first lens part 200, refracted and transmitted towards the optic axis 4, and emitted as parallel light which is refracted to be nearly parallel to the optic axis 4, through the second aspheric lens surface 220, so that the directionality of the light is improved.

The light emitted from the LED 2 at 35° or more is incident on the slope plane of incidence 310 of the second lens part 300 and refracted towards the plane of reflection 320. The refracted light is totally reflected towards the plane of emission 330 by the oval plane of reflection 320. The totally reflected light is emitted as the parallel light which is refracted to be nearly parallel to the optic axis 4, through the concave plane of emission 330, to improve the directionality thereof.

Therefore, when an illumination device uses the focusing lens 100 which emits the light emitted from the LED 2 as the parallel light with the improved directionality, it is capable of effectively illuminating a local region at a long distance.

The above-described operation of the focusing lens for the LED will be described in detail with reference to the following exemplary embodiment:

In the embodiment, a light source uses an LED 2 which is Lambertian type. For a focusing lens 100, the above-described aspheric lens is used to correct a free refractive direction of all light.

That is, the focusing lens 100 comprises: a first lens part (aspheric bi-convex lens) 200 including first and second aspheric lens surfaces 210 and 220; and a second aspheric lens part (aspheric plano-convex lens) 300 including a slope plane of incidence 310 concentrating ambient light, an outward oval plane of reflection 320, and an concave plane of emission 330.

The light diffusely emitted from the LED 2 is concentrated by the focusing lens 100, so that the radiation angle is reduced. That is, among the light emitted from the LED 2, the light under about 35° (central light) is emitted to be parallel to an optic axis 4 through the first lens part (aspheric bi-convex lens) 200 and the light at 35° or more (ambient light) is emitted to be parallel to the optic axis 4 through the second lens part (aspheric plano-convex lens) 300.

In principle, aberration of light can be corrected when the light is allowed to be refracted in a desired direction by unchanging the curvature around an optic axis of a surface and changing the curvature of a point of incidence. That is, when an aspheric is applied, a refraction direction of all light which has different points of incidence can be adjusted by controlling an angle of incidence. Although the refraction direction of light cannot be controlled in a sphere, it is possible to correct any other aberrations in the aspheric.

In the rectangular coordinates system (X, Y, Z) in which an X-axis is the optic axis, the surfaces of rotational symmetry are indicated by the following expansion:

$$X = a_1 \rho^2 + a_2 \rho^4 + a_3 \rho^6 + \ldots$$

$$\rho^2 = Y^2 + Z^2$$

In the sphere, when $a_1$ is found, $a_2$ and the following are automatically found. However, in the aspheric, $a_2$ and the following can be free given.

When the aspheric is used, the number of composition is reduced and what is unrealized on the sphere only is realized.

On a specific condition, an aspheric aberration can be completely removed as for the velocity of a light. The spherical aberration of the velocity of light parallel to the optic axis is zero but it increases as the light is progressively out of the optic axis. The completeness in the aberration correction is the major characteristic of the aspheric.

In stead of the restrictive aberration correction, the degree of freedom in the aspheric can be considered for use in correcting much more aberrations of light rays, aberrations which need to be absolutely removed, and aberrations which could not be removed by typical methods.

In general, when an optical system using an aspheric is designed, an optical system comprising only a sphere is first designed and evaluated. Thereafter, when an aberration occurs and it cannot be solved by a typical method, a process of applying an aspheric is sought to remove the aberration.

For example, as a test to remove an aberration occurring in a spherical lens, glass may changed, a single lens may be replaced by a cemented lens or may be divided, a new element may be added, or distribution and constitution of power may be changed. Aspheric can be considered as one of the methods to correct or remove aberrations.

The focusing lens for the LED according to the present invention uses or applies the advantages of the aspheric lens, to freely control the light diffusely emitted from the LED and to be applied to a system as a designer desires.

Below, Tables 1 and 2 represent the lens surface data and the aspheric coefficients according to the exemplary embodiment of the present invention.

TABLE 1

(Unit: mm)

| | | Radius of curvature | Surface distance | Refractive index | Abbe's number |
|---|---|---|---|---|---|
| screen | | | | 1.0 | |
| 1st lens part | 2nd aspheric lens surface | 5.05 | 8.0 | 1.49 | 57.1 |
| | 1st aspheric lens surface | −55.69 | −4.9 | 1.0 | |
| 2nd lens part | Plane of emission | −35 | 11.2 | 1.49 | 57.1 |
| | Plane of reflection | −4.55 | 0.1 | 1.0 | |
| Package lens | | 2.79 | 2.79 | 1.49 | 57.1 |
| LED chip | | | 0 | | |

TABLE 21

(Unit: mm)

| | | | Aspheric coefficient | | | |
|---|---|---|---|---|---|---|
| Lens surface | | CC (conic constant) | $A^4$ | $A^6$ | $A^8$ | $A^{10}$ |
| 1st lens part | 2nd aspheric lens surface | −0.23529 | −7.63E−04 | −3.28E−06 | 7.784E−07 | −2.38E−08 |
| | 1st aspheric lens surface | −13.44252 | 7.529E−05 | 6.006E−05 | 2.634E−07 | 1.203E−07 |
| 2nd lens part | Plane of emission | 0 | 0 | 0 | 0 | 0 |
| | Plane of reflection | −1.02 | 0 | 0 | 0 | 0 |

The radius of curvature of the screen, which is not indicated in the lens surface data of Table 1, is infinite, that is, a flat plane. The optic axial distance from the screen to the second aspheric lens of the first lens part is also infinite. That is, this means that an object is in an infinite distance from the lens surface.

The refractive index from the surface of the object to the second aspheric lens surface of the first lens part is 1.0 (in air). The radius of curvature of the second aspheric lens surface of the first lens part is 5.05, the surface distance (center thickness) thereof is 8.0, and the refractive index thereof is 1.49. Likewise, the radius of curvature, surface distance and refractive index up to the top surface are sequentially indicated.

The aspheric coefficients according to the exemplary embodiment are represented in FIG. 2. The aspheric coefficient means a coefficient derived when a surface shape is represented by Formula (1) as follows:

$$X = CY^2/\{1+(1-KC^2Y^2)^{1/2}\} + A^4Y^4 + A^6Y^6 + A^8Y^8 + A^{10}Y^{10} + \ldots \quad (1)$$

wherein,

X: distance from a definite point of the lens in the direction towards the optic axis Y: distance from the optic axis in the vertical direction (to a tangent line of the aspheric definite point C: reciprocal number of the radius of curvature in the definite point of the lens K: conic constant $A^4$, $A^6$, $A^8$ and $A^{10}$: $4^{th}$, $6^{th}$, $8^{th}$ and $10^{th}$ aspheric coefficients Therefore, when the coefficient of each of K, $A^4$, $A^6$, $A^8$ and $A^{10}$ is given, the height of the lens surface, that is, the surface shape, is determined according to Formula (1).

Now, the contents of the data represented in Tables 1 and 2 will be understood based on the foregoing. Specifically, among the surface distances represented in Table 1, the surface distance of the second aspheric lens surface of the first lens part means the distance between the first lens part and the second lens part. Therefore, when the value of the surface distance of the second aspheric lens surface is −4.9 mm, the two lenses are positioned to overlap. This method which can be realized in a plastic aspheric lens means that two lenses are united in another aspheric shape.

The plane of reflection of the second lens part (aspheric piano-convex lens) performs total internal reflection.

Here, the total internal reflection is the reflection of light having 100% reflexibility, i.e., a phenomenon that all of the light is reflected on a boundary surface of an object.

That is, when light is optically incident from a high density to a low density medium and the angle of incidence is greater than a specific angle (critical angle), all of the light is reflected on the boundary surface and no refracted rays of light exist. This phenomenon is called the total internal reflection. The minimum value of the angle of incidence at which the total internal reflection can occur is called the critical angle.

Therefore, when light is incident from a medium with a higher refractive index to one with a lower refractive index, the angle of refraction becomes greater than the angle of incidence. Then, the angle of refraction increases as the angle of incidence increases. Here, the critical angle means the angle of incidence where the angle of refraction is 90°.

Accordingly, the total internal reflection occurs only when light is incident on a denser material to a rarer material at a greater angle than the critical angle.

As illustrated in FIG. 3, when light is incident a material 1 with a higher refractive index to a material 2 with a lower refractive index, the angle of refraction y is greater than the angle of incidence. As the angle of refraction i increases, the angle of incidence increase. However, when the angle of refraction y is 90°, all of the light with the angle of incidence greater than 90° is reflected.

The above-described phenomenon is called the total internal reflection, and where the angle of refraction is 90, the angle of incidence $i_c$ is called the critical angle for the total internal reflection. The light being incident at the critical angle is given by $\sin i_c/\sin 9° n_{12}$ or $\sin i_c = n_{12}$ ($n_{12} < 1$). When the refractive index of the material 1 is n and the material 2 is air, $\sin i_c = n_2/n_1 = 1/n$ or $i_c = \sin^{-1}(1/n)$.

Based on the above explanation, a process of concentrating the light diffusely emitted from the LED by the focusing lens so that the radiation angle is reduced will be described.

Below, Table 3 represents changes in the radiation angle, by ray tracing during the process of concentrating lights emitted from the LED by the focusing lens, according to the exemplary embodiment.

TABLE 3

(Unit: degree)

| Radiation angle of LED | Emission angle of 1st aspheric lens surface | Emission angle of 2nd aspheric lens surface |
|---|---|---|
| 0.00 | 0.00 | 0.00 |
| 8.00 | 5.16 | 0.84 |
| 16.00 | 10.27 | 2.13 |
| 24.00 | 15.31 | 3.32 |
| 32.00 | 20.65 | 3.04 |

| Radiation angle of LED | Emission angle of plane of incidence | Emission angle of plane of reflection | Emission angle of plane of emission |
|---|---|---|---|
| 40.00 | 57.21 | 5.58 | 0.34 |
| 48.00 | 61.66 | 4.99 | 0.53 |
| 56.00 | 66.44 | 4.47 | 0.63 |
| 64.00 | 71.47 | 3.94 | 0.57 |
| 72.80 | 76.68 | 3.31 | 0.23 |
| 80.00 | 81.99 | 2.49 | 0.51 |

As it can be known in Table 3 above, while the light emitted from the LED passes through each aspheric lens of the focusing lens within the range of the off-axis, 0° to 80°, the light is finally emitted as parallel light on the plane of emission at the angle which is not in excess of maximally about 3.5°.

Each light is controlled by the focusing lens which sets the conditions for the aspheric and total internal reflection as described above. Accordingly, the angle on the plane of emission finally is maximally reduced, to minimize the loss of light. Further, the radiation angle is formed to be very small, so that a user can irradiate a desired local region at a long distance.

In accordance with the focusing lens for the LED of the present invention, all of the light emitted from the LED is emitted as parallel light with improved directionality, which is parallel to the optic axis, by the focusing lens with all characteristics of the aspheric and total internal reflection. Consequently, the loss of light emitted from the LED is minimized and the angle of the emitted is so maximally reduced, to effectively illuminate a local region at a long distance.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A focusing lens for an LED, which concentrates light emitted from the LED so as to have directionality parallel to an optic axis, comprising:
    a transparent body;
    a first lens part formed in the body; and
    a second lens part covering the first lens, and
    wherein the first lens comprises:
    first and second aspheric lens surfaces which are convex in different sizes and are formed on planes being symmetric to each other; and
    wherein the second lens comprise:
    a plane of incidence formed to protrude from an outer circumference of the second aspheric lens surfaces, the plane of incidence into which the LED is inserted and which is configured to allow the light emitted from the LED to be incident and refracted;
    a plane of reflection formed to have an oval-shaped curved surface which extends and slopes to be progressive wider from the plane of incidence towards the second aspheric lens surface, the plane of reflection which is configured to allow the light emitted from the LED to be totally reflected; and
    a plane of emission formed to have a concave curved surface which extends and slopes from the plane of reflection towards the second aspheric lens surface, the plane of emission which is configured to allow the light emitted from the LED to be refracted and emitted as light being parallel to the optic axis.

2. The focusing lens as claimed in claim 1, wherein the plane of reflection sets a condition of total internal reflection.

3. The focusing lens as claimed in claim 1, wherein the plane of incidence is formed to slope to get progressively wider outward from the first aspheric lens surface towards an end of the plane of incidence.

4. The focusing lens as claimed in claim 1, wherein, when a radiation angle of an off-axis of the LED is 0° to 32°, the first aspheric lens surface is formed to have an emission angle of 0° to 21°, and the second aspheric lens surface is formed to have an emission angle of 0° to 3.5°.

5. The focusing lens as claimed in claim 2, wherein, when a radiation angle of an off-axis of the LED is 0° to 32°, the first aspheric lens surface is formed to have an emission angle of 0° to 21°, and the second aspheric lens surface is formed to have an emission angle of 0° to 3.5°.

6. The focusing lens as claimed in claim 3, wherein, when a radiation angle of an off-axis of the LED is 0° to 32°, the first aspheric lens surface is formed to have an emission angle of 0° to 21°, and the second aspheric lens surface is formed to have an emission angle of 0° to 3.5°.

7. The focusing lens as claimed in claim 4, wherein, when the radiation angle of an off-axis of the LED is 40° to 80°, the plane of incidence is formed to have an emission angle of 57° to 82°, the plane of reflection is formed to have an emission angle of 2° to 6°, and the plane of emission is formed to have an emission angle of 0.3° to 0.65°.

8. The focusing lens as claimed in claim 5, wherein, when the radiation angle of an off-axis of the LED is 40° to 80°, the plane of incidence is formed to have an emission angle of 57° to 82°, the plane of reflection is formed to have an emission angle of 2° to 6°, and the plane of emission is formed to have an emission angle of 0.3° to 0.65°.

9. The focusing lens as claimed in claim 6, wherein, when the radiation angle of an off-axis of the LED is 40° to 80°, the plane of incidence is formed to have an emission angle of 57° to 82°, the plane of reflection is formed to have an emission angle of 2° to 6°, and the plane of emission is formed to have an emission angle of 0.3° to 0.65°.

\* \* \* \* \*

UNITED STATES PATENT AND TRADEMARK OFFICE
CERTIFICATE OF CORRECTION

PATENT NO.         : 7,411,742 B1                                        Page 1 of 1
APPLICATION NO. : 11/690866
DATED              : August 12, 2008
INVENTOR(S)        : Jin-Ho Kim, Shung-Hoon Hwang and Hee-Joong Lee It is certified that error appears in the above-identified patent and that said Letters Patent is hereby corrected as shown below:

Title page

Item [30] add:

Related Foreign Application Data:
Korean Patent Application No. 10-2007-0017123, filed February 20, 2007

Signed and Sealed this

Thirtieth Day of September, 2008

JON W. DUDAS
*Director of the United States Patent and Trademark Office*